(12) United States Patent
Shen et al.

(10) Patent No.: US 12,197,826 B2
(45) Date of Patent: Jan. 14, 2025

(54) METHOD FOR REDUCING INLINE DIRECTIVITY OF AIR-GUN SOURCE SIGNATURE BY OPTIMIZING SPATIAL DISTRIBUTION OF AIR-GUNS

(71) Applicant: SECOND INSTITUTE OF OCEANOGRAPHY, MINISTRY OF NATURAL RESOURCES, Hangzhou (CN)

(72) Inventors: Honglei Shen, Hangzhou (CN); Chunhui Tao, Hangzhou (CN); Hanchuang Wang, Hangzhou (CN); Jianping Zhou, Hangzhou (CN); Lei Qiu, Hangzhou (CN); Yunlong Liu, Hangzhou (CN)

(73) Assignee: SECOND INSTITUTE OF OCEANOGRAPHY, MINISTRY OF NATURAL RESOURCES, Hangzhou (CN)

( * ) Notice: Subject to any disclaimer, the term of this patent is extended or adjusted under 35 U.S.C. 154(b) by 747 days.

(21) Appl. No.: 17/367,585

(22) Filed: Jul. 5, 2021

(65) Prior Publication Data
US 2021/0334437 A1 Oct. 28, 2021

Related U.S. Application Data

(63) Continuation of application No. PCT/CN2019/111887, filed on Oct. 18, 2019.

(30) Foreign Application Priority Data

Sep. 9, 2019 (CN) .......................... 201910857817.3

(51) Int. Cl.
*G06F 30/20* (2020.01)
*G01V 1/38* (2006.01)

(52) U.S. Cl.
CPC ............ *G06F 30/20* (2020.01); *G01V 1/3843* (2013.01)

(58) Field of Classification Search
CPC .......... G06F 30/20; G06F 30/25; G06F 30/27; G06F 30/28; G06F 2111/00; G06F 2119/22; G01V 1/3843
See application file for complete search history.

(56) References Cited

U.S. PATENT DOCUMENTS

| 8,837,255 B2* | 9/2014 | Ross | G01V 1/006 367/24 |
| 2008/0011540 A1* | 1/2008 | Moldoveanu | G01V 1/38 181/110 |
| 2017/0219732 A1* | 8/2017 | Poole | G01V 1/38 |

FOREIGN PATENT DOCUMENTS

| CN | 102749648 A | 10/2012 |
| CN | 103454672 A | 12/2013 |

(Continued)

OTHER PUBLICATIONS

R. A. Fisher, "IX. On the Mathematical Foundations of Theoretical Statistics", pp. 309-368, (Year: 1921).*

(Continued)

*Primary Examiner* — Kibrom K Gebresilassie
(74) *Attorney, Agent, or Firm* — W&G Law Group

(57) ABSTRACT

A method for reducing inline directivity of an air-gun source signature by optimizing spatial distribution of air-guns is provided according to the present application, which relates to a field of design and optimization of an air-gun source. An evaluation standard in the air-gun distribution in an air-gun array direction is proposed. By a combination optimization along both the inline and depth directions, a design scheme having evidently broader effective bandwidth and effective take-off angle width than a design scheme of a conventional (Continued)

source is obtained, with which the directivity of the air-gun source signature can be reduced.

5 Claims, 4 Drawing Sheets

(56) References Cited

FOREIGN PATENT DOCUMENTS

| | | |
|---|---|---|
| CN | 108957545 A | 12/2018 |
| CN | 109239769 A | 1/2019 |
| CN | 109633737 A | 4/2019 |
| WO | 2009077762 A2 | 6/2009 |

OTHER PUBLICATIONS

M. B. Mueller, D. F. Haliday, D. V. Manen, J. O. A. Robertsson, "Optimizing near-orthogonal ar-gun firing sequences for marine simulataneous source separation" pp. V415-V423, (Year: 2016).*
S. Zhang, S. P. Wang, A.M Zhang, Y. Q. Li, "Numerical study on attenuation of bubble pulse through tuning the air-gun array with the particle swarm optimization method", pp. 13-22, ScienceDirect (Year: 2017).*
International Search Report (PCT/CN2019/111887); Date of Mailing: May 26, 2020.
"Modeling of multi-depth slanted airgun source for deghosting" [Shen, Hong-lei et al.] (Dec. 31, 2014) pp. 405-417.

* cited by examiner

METHOD FOR REDUCING INLINE DIRECTIVITY OF AIR-GUN SOURCE SIGNATURE BY OPTIMIZING SPATIAL DISTRIBUTION OF AIR-GUNS

CROSS-REFERENCE TO RELATED APPLICATIONS

This application is a continuation of International Application No. PCT/CN2019/111887, filed on Oct. 18, 2019, which claims priority to Chinese Patent Application No. 201910857817.3, filed on Sep. 9, 2019, both of which are hereby incorporated by reference in their entireties.

TECHNICAL FIELD

The present application relates to a field of design and optimization of an air-gun source, and particularly to a method for reducing directivity of air-gun source signature by adjusting a spatial distribution of air-guns.

BACKGROUND

In modern marine seismic exploration, a tuned air-gun array is widely used. Compared to a single air-gun source, the tuned array has evident advantages in having a higher peak-to-bubble ratio and a better absolute energy (penetrability), etc. However, source signature obtained from the tuned array normally has strong directivity, i.e. varying along take-off angles, resulted from the source ghost and the spatial distribution of the array. This variation brings challenges for subsequent processing and greatly degrades imaging quality. The common practice used to attenuate the directivity effect is directivity-targeted source signature deconvolution in a Tau-p/F-K domain which has been extended to be applicable for 3D and shot-to-shot inconsistency. However, the performance of designature strongly depends on the signal to noise ratio (SNR) and often struggles in a frequency range with low SNR, e.g., in the vicinity of a ghost notch and an interference notch. With the development of high-resolution seismic imaging and high precision velocity model building, a source design that allows a wide effective frequency bandwidth that is uniform at all incidence angles would be appealing. Recent seismic acquisition methods such as the source over cable (Vinje, V, et at., 2017. Shooting over the seismic spread. First Break, 35(6), 97-104.) also bring higher demands on the source signature's consistency from both the negative and positive directions.

SUMMARY

In views of the above problems, an objective of the present disclosure is to provide a method for reducing directivity of air-gun source signature by adjusting a spatial distribution of individual air-guns. Firstly, the effects of the spatial distribution of the air-guns on the ghost notch and the interference notch are explained. Based on this, an evaluation metric to evaluate the effects of the air-gun distribution along a seismic source array (inline) direction is proposed. By an optimization along an inline direction and a depth direction, a design scheme having evidently better effective bandwidth and effective take-off angle width than a design scheme of a conventional source is obtained.

The technical solution of the present application is as follows.

A method for reducing inline directivity of an air-gun source signature by optimizing a spatial distribution of air-guns includes following steps:

1) for an air-gun array, setting a constraint condition in which a spacing between adjacent air-guns and a horizontal spacing between adjacent air-guns satisfy a preset range, and setting an objective function based on the spatial distributions of the air-guns;

in a vertical plane, determining a maximum of the objective function by changing an inline location and a depth location of each single air-gun, obtaining inline locations and depth locations of air-guns corresponding to the maximum of the objective function, as an optimized air-gun array; and 2) setting different firing times for air-guns at different depths in the optimized air-gun array, to align downgoing primaries of air-guns at different depths to reduce the inline directivity of the air-gun source signature.

As a preferred solution of the present application, the spacing between adjacent air-guns is controlled within 3 to 5 m, so as to avoid strong interference between air-gun wave fields and reduce a collision risk of air-guns (in cases of high waves/bad weather).

As a preferred solution of the present application, the horizontal spacing between adjacent air-guns is controlled within 1 to 3 m, so as to ensure that a chain is loaded vertically.

As a preferred solution of the present application, the objective function has a positive correlation with an effective take-off angle width of an air-gun.

As a preferred solution of the present application, the objective function is expressed by concentration degree as follows:

$$F_{con} = \frac{n}{\sum_{i=1}^{n}(x_i - \bar{x})^2}$$

where $x_i$ is a location of the i-th air-gun along an inline direction, $\bar{x}$ represents an average inline location of all the air-guns along the inline direction, and n represents the total number of air-guns.

As a preferred solution of the present application, setting different firing times for air-guns at different depths in the optimized air-gun array includes: setting a first firing time for an air-gun at a first depth; and setting a second firing time for an air-gun at a second depth, wherein the second depth is deeper than the first depth, and the second firing time is later than the first firing time.

As a preferred solution of the present application, determining the maximum of the objective function by changing an inline location and a depth location of each single air-gun includes: determining the maximum of the objective function by changing the inline location and the depth location of each single air-gun, in a case of a constant spacing between two air-guns.

In the present application, it is reasonable to perform the optimization by guiding the source design with the concentration degree so as to reduce the directivity of the air-gun source signature. The optimized air-gun combination source has a more uniform energy distribution, and the ghost and interference notches are effectively compensated. The optimized source can achieve an effective take-off angle width of ±30° for up to 250 Hz.

BRIEF DESCRIPTION OF DRAWINGS

FIG. 7 is an energy distribution result of the horizontal source in FIG. 6a.

DESCRIPTION OF EMBODIMENTS

Further description of the present application will be made in connection with detailed embodiments and accompanying drawings below.

The far-field signature for an air-gun source may be considered to be a linear superposition of source signature and their ghosts. It is assumed that the source is constituted by n air-guns, and the far-field signature thereof may be represented by:

$$f(t, \alpha) = \sum_{i=1}^{n} \left[ \frac{1}{r_i(\alpha)} n_i(t + t_{delay} + t_{far}) + \frac{R}{r'_i(\alpha)} n_i(t + t_{delay} + t_{far} + \Delta t_i(\alpha)) \right], \quad (1)$$

where $n_i$ represents signature of the i-th air-gun; $r_i$ stands for a distance between the the i-th air-gun and far-field location, $r'_i$ stands for a distance between the i-th mirrored air-gun referring to the sea-surface and far-field location, R is a reflection coefficient of the sea surface which is generally close to −1 for the flat sea surface, $t_{delay}$ is a preset firing-time delay of the air-gun, which is generally an option for multi-depth sources when aligning the down-going primaries, $t_{far}$ is a propagation time referring to the spacing from the air-gun source to the far-field location, and $\Delta t_i (\alpha)$ is a time delay of the ghost to the primary for the i-th air-gun, which is generally expressed by $\Delta t_i (\alpha) = 2h_i \cos(\alpha)/c$, where c is a water sound speed, and $\alpha$ is the take-off angle.

Fourier transform is performed to Equation 1, to obtain a frequency-domain expression of the far-field signature:

$$F(w, \alpha) = \sum_{i=1}^{n} N_i(w) \left[ \frac{1}{r_i(\alpha)} e^{iw(t_{delay} + t_{far})} + \frac{R}{r'_i(\alpha)} e^{iw(t_{delay} + t_{far} + \Delta t_i(\alpha))} \right], \quad (2)$$

where $N_i(w)$ represents a Fourier transformed frequency-domain signature for the i-th air-gun.

For a conventional horizontal source made up of multiple air-guns, we derive an expression for the first non-zero ghost-notch frequency and the first interference-notch frequency referring to different take-off angles as:

$$f_{notch} = \frac{c}{2h\cos(\alpha)} * \frac{c}{nx\sin(\alpha)} (n \in 2, 3, 4, \ldots), \quad (3)$$

where n represents the number of air-guns, x represents a spacing between two guns, and h is the source depth. A first-half part of Equation 3 represents the ghost notch introduced by the sea-surface reflected source ghost, and a second-half part thereof represents an interference notch caused by a spatial distribution of an air-gun array.

Figure 1:
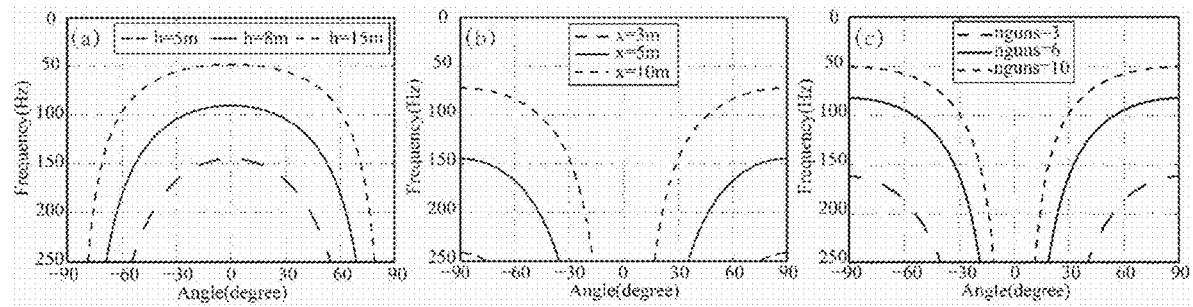
FIG. 1 is curve graphs of first frequency notches referring to different parameters; (a) ghost notches when the source depth changes; (b) interference notches when the air-gun spacing changes; (c) interference notches when the number of air-guns changes.

It can be seen from the Equation 3 that the ghost notch is defined by the air-gun depth. Generally, the first non-zero ghost notch defines the upper effective bandwidth of the source signature. Moreover, the deeper deployment results in a lower non-zero notch frequency, as shown in FIG. 1a. The interference notch is jointly determined by the number of air-guns and the spatial distribution thereof. Different from the ghost notch, the interference notch comes from the sides and mainly defines the effective take-off angle width. With the increase of the frequency, an angle corresponding to the interference notch is reduced gradually, as shown in FIGS. 1b and 1c. A smaller spatial interval and a smaller number of air guns result in a higher interference frequency notch, in other word, a wider effective take-off angle width without notch influence for a certain frequency.

To quantify a relationship between the spatial arrangement of the geometry and the effective take-off angle width of the source signature, a concentration-degree parameter $F_{con}$ of the air-gun distribution along a seismic source array inline direction is proposed as an evaluation standard for guiding the optimization design of the air-gun array:

$$F_{con} = \frac{n}{\sum_{i=1}^{n}(x_i - \bar{x})^2} \quad (4)$$

where $x_i$ is a location of the i-th air-gun along inline direction, and $\bar{x}$ represents an average location of all the air-guns along the line direction.

Figure 2:
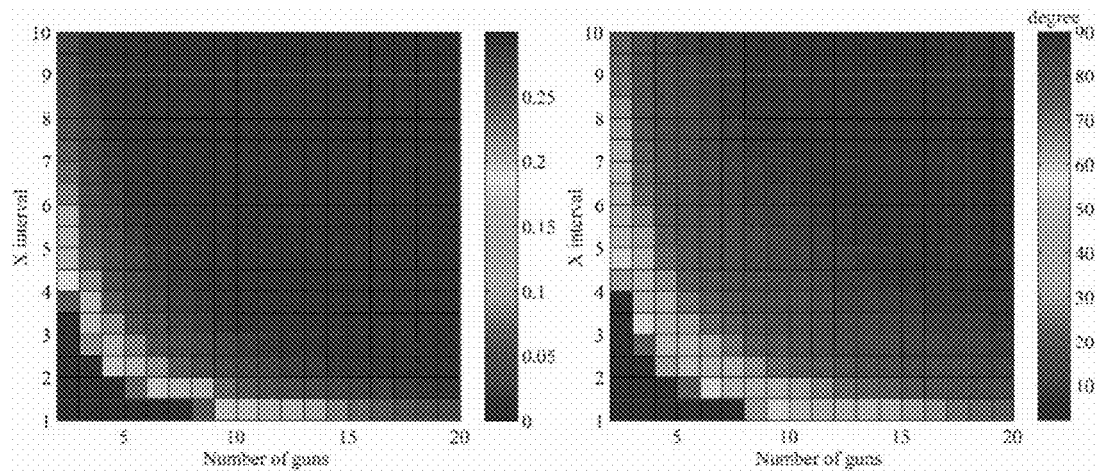
FIG. 2 is an $F_{con}$ result (left) and an effective angle width (right) for air-gun source with different geometries.

FIG. 2 shows the relationship between $F_{con}$ and an effective take-off angle width (taking 150 Hz for an example) in different arrangement modes. In FIG. 2, the effective angle width of 90° means that the interference notch does not touch the frequency of 150 Hz. Similar to the conclusion obtained from FIG. 1, a smaller inline interval and fewer air-guns result in a higher concentration degree and correspondingly improve the inline directivity by extending the effective take-off angle width. Meanwhile, by comparing the left and right diagrams in FIG. 2, it is possible to find that there is a clear positive correlation between the concentration parameter $F_{con}$ and the effective take-off angle width, which showing the reasonability of guiding the optimization of the source design with the concentration degree in order to reduce the directivity of the air-gun source signature.

Figure 3:
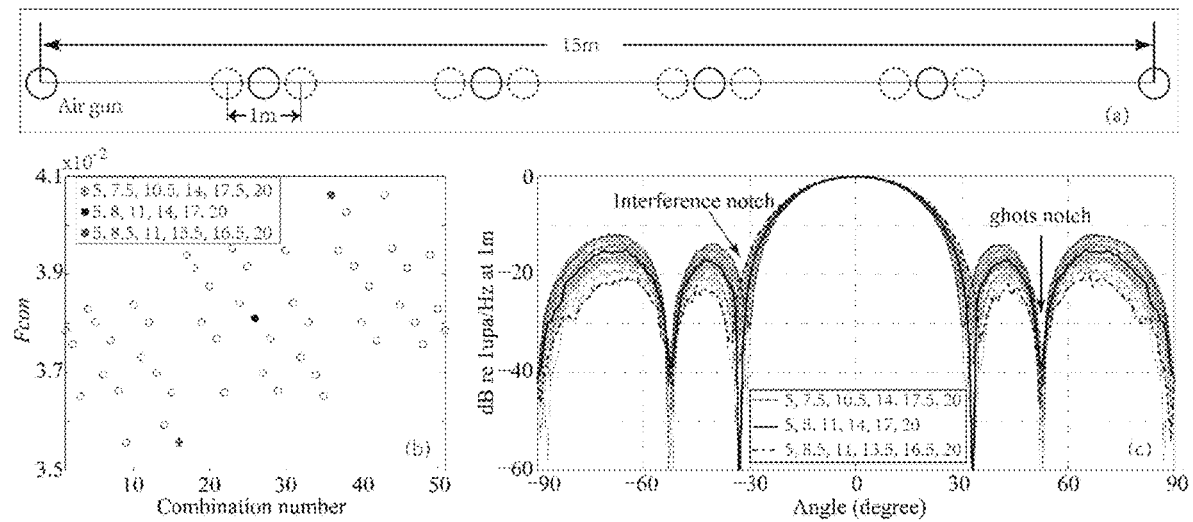
FIG. 3 is a directivity analysis with various air-guns intervals; (a) possible locations for the air-guns; (b) $F_{con}$ values for all possible source design combinations; and (c) 150 Hz energy response referring to different combinations.

For a normal horizontal source array, the concentration degree can be increased by adjusting the spacing between air-guns, thus broadening the effective take-off angle width of the source signature. FIG. 3a shows possible locations for air-guns in the air-gun array in the case that the length of the air-gun array remains unchanged. The calculation results of the concentration degree for all possible source design combinations are shown in FIG. 3b, where three circled points in the figure respectively correspond to the source combinations with a maximum, a minimum, and an average of $F_{con}$ (in the average case that the locations of the air-guns remain the same). FIG. 3c intuitively shows frequency responses at 150 Hz corresponding to different combinations. It can be seen that the effective bandwidth of the signature can be altered by changing the relative position of the air-guns. The source design with the maximum $F_{con}$ results in the widest effective angle width for the given 150 Hz. On the contrary, the minimum $F_{con}$ corresponds to the narrowest effective angle width that once again demonstrates the indication significance of $F_{con}$ in inline directivity.

Figure 4:
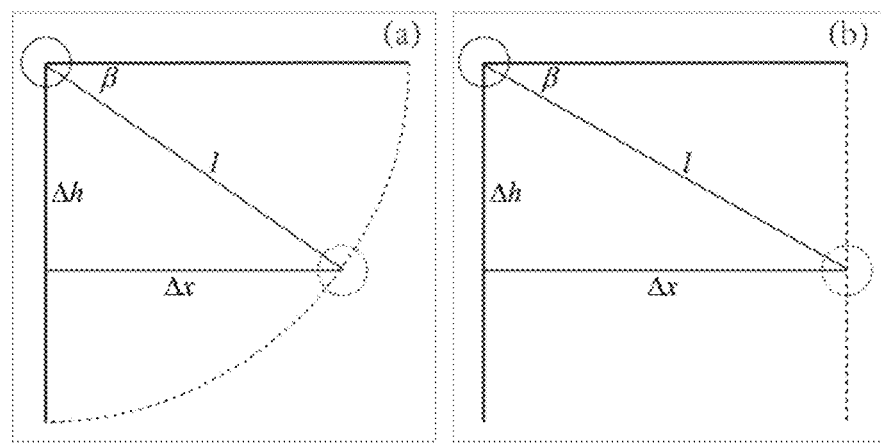
FIG. 4 is a slant two-gun combination geometry; (a) source geometry with a constant distance l between the two guns; and (b) source geometry with a constant inline distance $\Delta x$ between the two guns.

Limited by a wave field interference and a potential collision risk, the air-guns' spacing for a normal source cannot be too small. This puts a practical limit on further improvement in the directivity reduction of the source signature. Furthermore, combination optimization along the inline direction is unable to change the location of the ghost notch. Considering that the ghost notch can be well compensated by applying a multi-depth synchronous excitation, an inline-depth combination optimization is proposed to achieve an idea of simultaneous compensation to the ghost notch and the interference notch, so as to weaken the directivity of the air-gun source. FIG. 4 shows two combination modes that can adjust the depth of the air-gun, i.e., remaining the constant spacing between two air-guns (FIG. 4a) and remaining the constant inline spacing between two air-guns (FIG. 4b).

For air-guns at different depths, a firing mode in which primaries are synchronized in the vertical direction is applied (Siliqi R., Payen T., Sablon R., and Desrues K. 2013. Synchronized multi-level source, a robust broadband marine solution. 83$^{rd}$ Annual International Meeting, SEG, Expanded Abstracts, 56-60.). In this firing mode, the primaries can be aligned along the vertical direction ($\alpha=0°$) by presetting the firing time. An interference notch may be represented in this case as follows:

$$f_{x\text{-}notch} = \begin{cases} \dfrac{c}{2[\Delta x \sin(|\alpha| - \beta) + \Delta h]} & (\alpha <= 0°, |\alpha| > \beta) \\ \dfrac{c}{2[\Delta h - \Delta x \sin(\beta - |\alpha|)]} & (\alpha <= 0°, |\alpha| <= \beta) \\ \dfrac{c}{2[\Delta x \sin(\alpha + \beta) - \Delta h]} & (\alpha > 0°) \end{cases} \quad (5)$$

where $\beta$ is an slanted angle as shown in FIG. 4.

Figure 5:
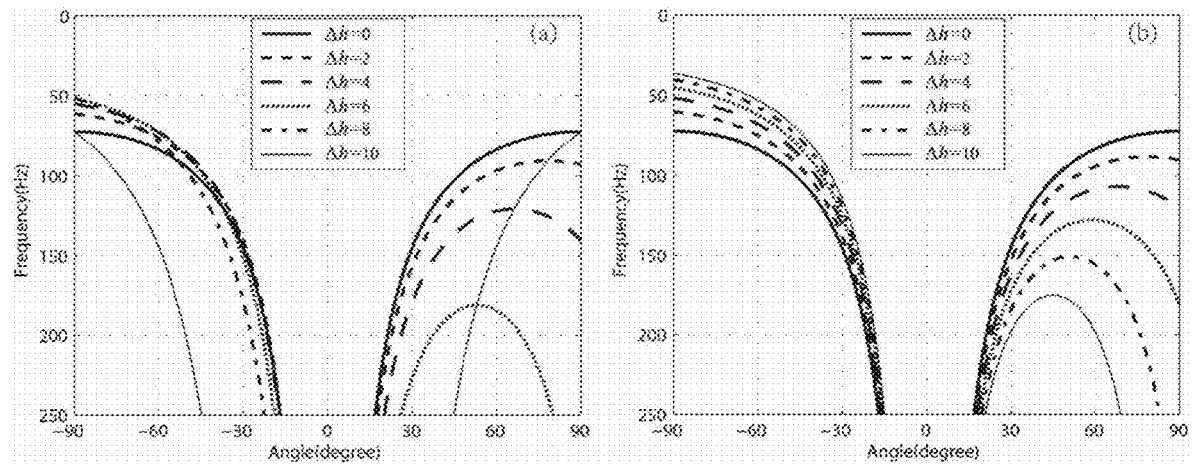
FIG. 5 is a first interference notch curves for the two source design modes shown in FIG. 4; (a) the constant distance/between the two guns being 10 m; and (b) the constant inline distance $\Delta x$ between the two guns being 10 m.

FIG. 5 shows the results for varying depth difference between the two air guns for both source design modes shown in FIG. 4. It can be seen from FIG. 5 that for the case of a constant distance between two air-gun (FIG. 5a), increasing the depth difference could effectively decrease the inline distance between the two air guns and then improve the inline concentration, which extends the effective take-off angle width towards both sides. When the air-gun is placed vertically ($\Delta h=10$ in this case), the maximum concentration of the air-gun is obtained. Correspondingly, the source signature has a minimum directivity. The effective take-off angle width is significantly widened, for example, from ±30° for 150 Hz referring to the horizontal case to ±60°. When the horizontal spacing between two air-guns is constant (FIG. 5b), $F_{con}$ will not be increased significantly by changing the depth of the air-gun. The effective take-off angle width of the signature is improved on one side, i.e. along the slanted direction of the air-gun array, but decreases on the other side. The overall effective angle width is almost unchanged when $\Delta h$ is small, especially on the high frequency end above 200 Hz.

As mentioned above, in field acquisitions, the spacing between two adjacent air-guns usually needs to be controlled in the range of 3-5 m, so as to avoid the strong interference between wave fields of the air-guns and reduce a collision risk between the adjacent air-guns. In view of this, in the design process, the spacing between the adjacent air-guns is ensured to be 3 to 5 m, and the horizontal spacing between adjacent air-guns is ensured to be 1 to 3 m (which ensures that the chains can be loaded vertically). As such, by using the concentration degree $F_{con}$ of the air-gun as an objective function, and 10 cm as a step of the horizontal spacing, the multi-depth source is optimized, to obtain a final optimized combination result as shown in FIG. 6b. Compared to the conventional source shown in FIG. 6a, $F_{con}$ of the optimized combination increases (in this particular case) from 0.038 to 0.172.

Figure 6:
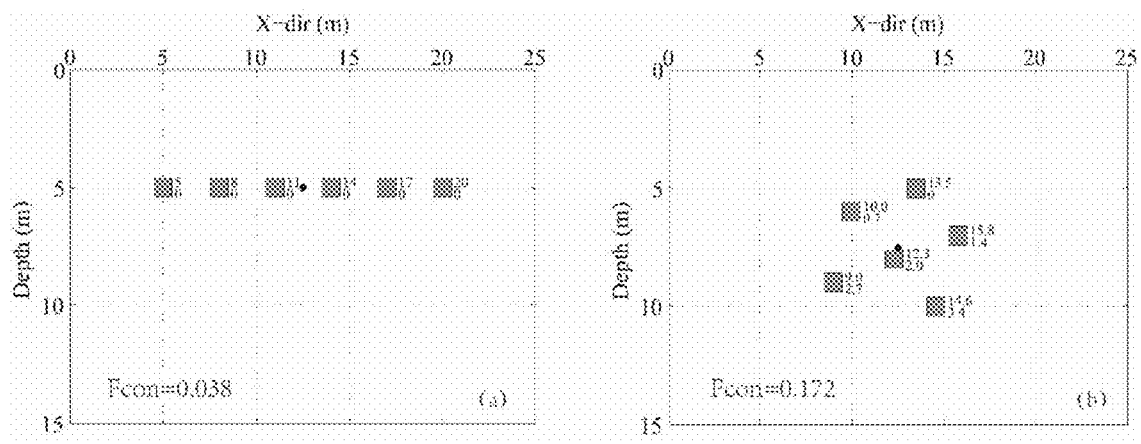
FIG. 6 is a comparison of source layouts between a horizontal source and an optimized source; (a) layout of a normal horizontal source; (b) layout of the optimized source.
Figure 7:
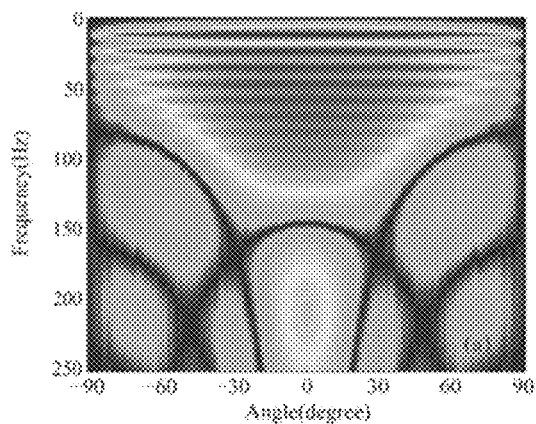
Figure 8:
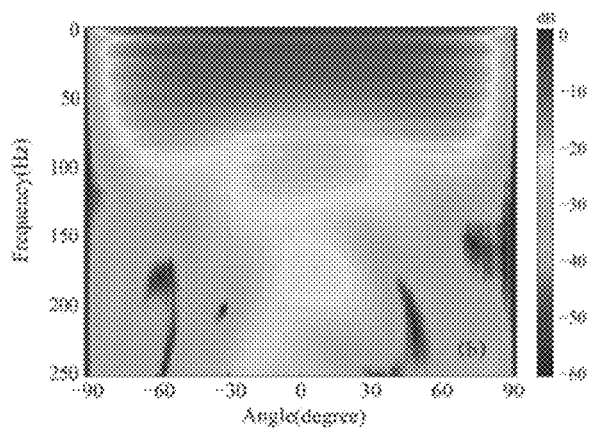
FIG. 8 is an energy distribution result of the optimized source in FIG. 6b.

FIG. 7 and FIG. 8 show comparison results of energy distribution results for two source layouts in FIG. 6. Obviously, it can be seen that the optimized depth combination source has a more uniform energy distribution with the ghost and interference notches being effectively compensated. With the optimized source design, it is possible to enable the effective take-off angle width to remain ±30° at a frequency up to 250 Hz, which would benefit modern acquisition approaches.

What is claimed is:

1. A method for reducing inline directivity of an air-gun source signature by optimizing a spatial distribution of air-guns, comprising:
   for an air-gun array, setting a constraint condition in which a spacing between adjacent air-guns and a horizontal spacing between adjacent air-guns satisfy a preset range, and setting an objective function based on the spatial distribution of the air-guns,
   wherein the objective function is expressed by:

$$F_{con} = \frac{n}{\sum_{i=1}^{n}(x_i - \bar{x})^2}$$

where $F_{con}$ represents a concentration-degree parameter objective function, $x_i$ represents a location of the i-th air-gun in a seismic source array inline direction, $\bar{x}$ represents an average inline location of all the air-guns in the seismic source array inline direction, and n represents the total number of air-guns;
   in a vertical plane, determining a maximum of the objective function by changing an inline location and a depth location of each single air-gun, in a case of a constant spacing between two adjacent air-guns, and obtaining inline locations and depth locations of air-guns corresponding to the maximum of the objective function, as an optimized air-gun array; and
   arranging air-guns at different depths based on the optimized air-gun array, setting a respective firing time for each of the air-guns, and firing each of the air-guns with the respective firing time to produce an optimized air-gun combination source, so as to align downgoing primaries of air-guns at different depths and to reduce an inline directivity of the air-gun source signature.

2. The method according to claim 1, wherein the spacing between adjacent air-guns is controlled within 3 to 5 m.

3. The method according to claim 1, wherein the horizontal spacing between adjacent air-guns is controlled within 1 to 3 m.

4. The method according to claim 1, wherein the objective function has a positive correlation with an effective take-off angle width of an air-gun source.

5. The method according to claim 1, wherein setting different firing times for air-guns at different depths in the optimized air-gun array comprises:
   setting a first firing time for an air-gun at a first depth; and
   setting a second firing time for an air-gun at a second depth,
   wherein the second depth is deeper than the first depth, and the second firing time is later than the first firing time.

* * * * *